(12) United States Patent
McDonley et al.

(10) Patent No.: US 12,705,412 B2
(45) Date of Patent: Aug. 11, 2026

(54) STANDARD CELL DIFFERENTIATION USING TOPOLOGY AND TRANSISTOR ATTRIBUTES

(71) Applicant: Battelle Memorial Institute, Columbus, OH (US)

(72) Inventors: Timothy A. McDonley, Grove City, OH (US); Josh Delozier, Columbus, OH (US); Benjamin Hayden, North Canton, OH (US); Kurtis Wickey, Springfield, OH (US)

(73) Assignee: Battelle Memorial Institute, Columbus, OH (US)

( * ) Notice: Subject to any disclaimer, the term of this patent is extended or adjusted under 35 U.S.C. 154(b) by 685 days.

(21) Appl. No.: 18/329,048

(22) Filed: Jun. 5, 2023

(65) Prior Publication Data

US 2023/0419011 A1 Dec. 28, 2023

Related U.S. Application Data

(60) Provisional application No. 63/355,128, filed on Jun. 24, 2022.

(51) Int. Cl.
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
CPC ............................ G06F 30/392; G06F 30/398
USPC .......................................................... 716/119
See application file for complete search history.

(56) References Cited

U.S. PATENT DOCUMENTS 7,584,448 B1 * 9/2009 Reynolds ................ G06F 30/34 716/138
7,665,054 B1 * 2/2010 Gopalakrishnan .... G06F 30/392 716/133
10,285,276 B1 * 5/2019 Kukal .................. H05K 3/0005
10,291,478 B1 * 5/2019 Hosamani ............... H04L 41/12
10,318,696 B1 * 6/2019 Yeung ................. G06F 30/3312
10,783,296 B1 * 9/2020 Ershov .................. G06F 30/327
10,956,650 B1 * 3/2021 Ku ........................ G06F 30/392
11,403,448 B1 * 8/2022 Yu ......................... G06F 30/392
11,675,766 B1 * 6/2023 Chen ................... G06F 16/9024 707/696
2002/0157063 A1 * 10/2002 Besson ................... G06F 30/30 716/102
2009/0313596 A1 * 12/2009 Lippmann ............. G06F 30/327 716/126
2015/0100928 A1 * 4/2015 Saghizadeh ............. G06F 30/31 716/102

(Continued)

*Primary Examiner* — Suresh Memula
(74) *Attorney, Agent, or Firm* — Secant IP, PLLC; Donald G. Weiss

(57) ABSTRACT

In an approach to standard cell differentiation using topology and transistor attributes, a first circuit representation of an unidentified cell is received. The first circuit representation of the unidentified cell is converted to a first graph. A second circuit representation of each of one or more golden reference cells are retrieved. The second circuit representation of each of the one or more golden reference cells are converted to one or more second graphs. The first graph is matched to each of the one or more second graphs. One or more match results are reported based on the matching of the first graph to each of the one or more second graphs.

20 Claims, 4 Drawing Sheets

(56) References Cited

U.S. PATENT DOCUMENTS

| | | | | |
|---|---|---|---|---|
| 2018/0341742 | A1* | 11/2018 | Yazdani | G06F 16/211 |
| 2023/0419011 | A1* | 12/2023 | McDonley | G06F 30/398 |
| 2024/0028811 | A1* | 1/2024 | Loiseau | G06F 30/398 |
| 2024/0176943 | A1* | 5/2024 | Xu | G06F 30/398 |

* cited by examiner

STANDARD CELL DIFFERENTIATION USING TOPOLOGY AND TRANSISTOR ATTRIBUTES

CROSS-REFERENCE TO RELATED APPLICATIONS

The present application claims the benefit of the filing date of U.S. Provisional Application Ser. No. 63/355,128, filed Jun. 24, 2022, the entire teachings of which application is hereby incorporated herein by reference.

STATEMENT REGARDING FEDERALLY SPONSORED RESEARCH OR DEVELOPMENT

This invention was made with government support under FA8650-15-D-1953, Task Order 4 FA8650-20-F-1134 awarded by the Air Force Research Laboratory. The government has certain rights in the invention.

TECHNICAL FIELD

The present application relates generally to integrated circuit verification and, more particularly, to standard cell differentiation using topology and transistor attributes.

BACKGROUND

Over the last 50 years advances in Integrated Circuits (ICs) have led to the production of IC devices of immense complexity and very small feature (node) size. Due to the specialized facilities and skill required to manufacture functional IC devices at advanced node sizes, modern designers of IC devices are often unable to physically manufacture their designs. Rather, such designers often outsource production of their IC designs to specialized manufacturing facilities, which may be located in a foreign country. As a result, the production of modern IC devices now often involves the use of complex, international supply chains. In the defense sector this can present a security issue, as the supply chain for producing a complex IC device may be difficult or impossible to secure using traditional defense industry solutions such as clearance and surveillance. This concern is augmented by the fact that—due to the small node sizes and complex designs involved—it can be difficult to detect whether the design of an IC was faithfully reproduced or modified during the manufacturing process.

A process design kit (PDK) is a set of files used within the semiconductor industry to model a fabrication process for the design tools used to design an integrated circuit. The PDK is created by the foundry defining a certain technology variation for their processes. Designers use the PDK to design, simulate, draw, and verify the design before handing the design back to the foundry to produce chips. The data in the PDK is specific to the foundry's process variation.

Graphic Design System II (GDSII) stream format is a database file format which is an industry standard for data exchange of integrated circuit or IC layout artwork. It is a binary file format representing planar geometric shapes, text labels, and other information about the layout in hierarchical form. The data can be used to reconstruct all or part of the artwork to be used in sharing layouts, transferring artwork between different tools, or creating photomasks.

BRIEF DESCRIPTION OF THE DRAWINGS

Reference should be made to the following detailed description which should be read in conjunction with the following figures, wherein like numerals represent like parts.

DETAILED DESCRIPTION

Figure 1:
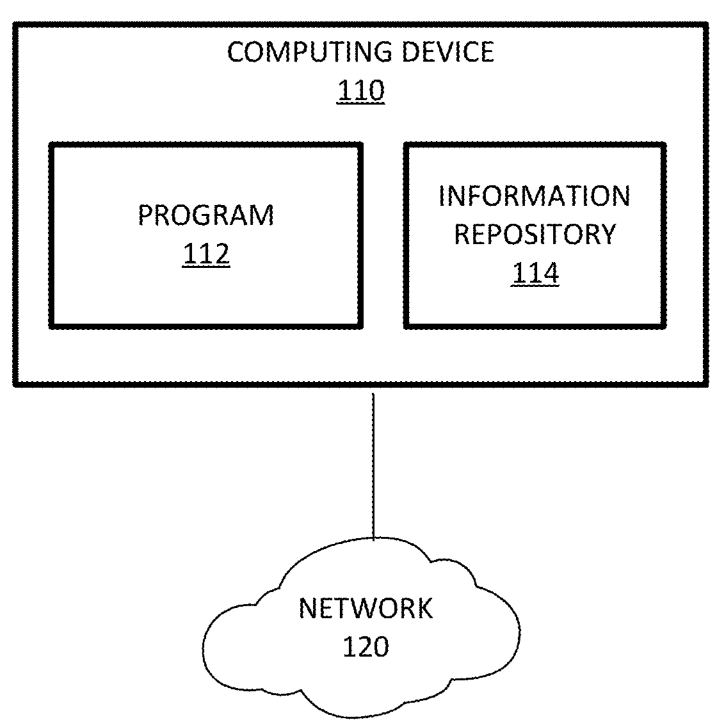
FIG. 1 is a functional block diagram illustrating one example of a distributed data processing environment suitable for operation of the disclosed system and method, consistent with the present disclosure.

The present disclosure is not limited in its application to the details of construction and the arrangement of components set forth in the following description or illustrated in the drawings. The examples described herein may be capable of other embodiments and of being practiced or being carried out in various ways. Also, it may be appreciated that the phraseology and terminology used herein is for the purpose of description and should not be regarded as limiting as such may be understood by one of skill in the art. Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive.

Production of Integrated Circuits (ICs) has largely been globalized. IC designers may utilize many different providers which can be responsible for a single task. This horizontal structure drastically improves to time-to-market and reduces manufacturing cost. However, use of contract foundries causes IC consumers to be concerned over potentially malicious or unspecified logic that might reside within their application. One solution is to use post-silicon design recovery and validation to ensure the authenticity of the remotely fabricated IC. Post-silicon design recovery and validation, however, yields a design layout, e.g., a GDSII design layout, that has no cell hierarchy. The cells in the layout need to be identified through some matching process. Many processes have trouble distinguishing cells. Further compounding the issue of fully differentiating cells that look identical on the layers used, to improve scalability many processes only use a subset of layers from the layout to carry out the matching. There exists a need in silicon verification to identify cells in the layout.

Disclosed herein are systems and a method that provide a scalable methodology for cell matching that may utilize all pertinent layers to capture the graph-based topology and/or transistor schematic and corresponding transistor attributes. Incorporating graph-based isomorphism and transistor attributes such as width or fin count (in a Fin Field-Effect Transistor (FinFET) process) may provide up to 100% differentiation between cells. The combination of graph isomorphism-based matching with exact and inexact (closest) matching attributes provides a means for differentiation. Inexact (closest) matching facilitates matching based on attributes that will vary due to process variations.

The systems and method disclosed herein may use a graph-based transistor schematic to represent standard cells from a given PDK. Graphs may be paired up based on graph isomorphism. Node and edge match conditions for the isomorphism incorporate attributes such as type (N-channel metal-oxide-semiconductor (nMOS), P-channel metal—oxide—semiconductor (pMOS), NET, etc.) and width for transistors or fin count for transistors in a FinFET process in order to differentiate cells that are identical apart from analog tuning. Attribute matching may be carried out in an exact or closest match criteria. The fitness of each match may be tracked as a value between 0 and 100. This matching process may also be adapted to fill cells that lack transistors by considering the topology.

In actual testing of the disclosed system and method, a 45 nm CMOS technology with 73 cells (not including fill) achieved 100% differentiation among active cells, and a 14 nm FinFET technology with 175 cells (includes fill cells) achieved 100% differentiation among active and fill cells.

FIG. 1 is a functional block diagram illustrating a distributed data processing environment, generally designated 100, suitable for operation of the program 112, consistent with the present disclosure. The term "distributed" as used herein describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the disclosure as recited by the claims.

Distributed data processing environment 100 includes computing device 110 optionally connected to network 120. Network 120 can be, for example, a telecommunications network, a local area network (LAN), a wide area network (WAN), such as the Internet, or a combination of the three, and can include wired, wireless, or fiber optic connections. Network 120 can include one or more wired and/or wireless networks that are capable of receiving and transmitting data, voice, and/or video signals, including multimedia signals that include voice, data, and video information. In general, network 120 can be any combination of connections and protocols that will support communications between computing device 110 and other computing devices (not shown) within distributed data processing environment 100.

Computing device 110 can be a standalone computing device, a management server, a web server, a mobile computing device, or any other electronic device or computing system capable of receiving, sending, and processing data. In some embodiments, computing device 110 can be a personal computer (PC), a desktop computer, a laptop computer, or any programmable electronic device capable of communicating with other computing devices (not shown) within distributed data processing environment 100 via network 120. In another embodiment, computing device 110 can represent a server computing system utilizing multiple computers as a server system, such as in a cloud computing environment. In yet another embodiment, computing device 110 represents a computing system utilizing clustered computers and components (e.g., database server computers, application server computers) that act as a single pool of seamless resources when accessed within distributed data processing environment 100.

In some embodiments, computing device 110 includes program 112. In some embodiments, program 112 is a program, application, or subprogram of a larger program for standard cell differentiation using topology and transistor attributes. In an alternative embodiment, program 112 may be located on any other device accessible by computing device 110 via network 120.

In some embodiments, computing device 110 includes information repository 114. In some embodiments, information repository 114 may be managed by program 112. In other embodiments, information repository 114 may be managed by the operating system of the computing device 110, alone, or together with, program 112. Information repository 114 is a data repository that can store, gather, compare, and/or combine information. In some embodiments, information repository 114 is located externally to computing device 110 and accessed through a communication network, such as network 120. In some embodiments, information repository 114 is stored on computing device 110. In some embodiments, information repository 114 may reside on another computing device (not shown), provided that information repository 114 is accessible by computing device 110. Information repository 114 includes, but is not limited to, system data, reference data, cell data, graph data, attribute data, and other data that is received by program 112 from one or more sources, and data that is created by program 112.

Information repository 114 may be implemented using any non-transitory volatile or non-volatile storage media for storing information, as known in the art. For example, information repository 114 may be implemented with random-access memory (RAM), solid-state drives (SSD), one or more independent hard disk drives, multiple hard disk drives in a redundant array of independent disks (RAID), an optical library, or a tape library. Similarly, information repository 114 may be implemented with any suitable storage architecture known in the art, such as a relational database, an object-oriented database, or one or more tables.

Figure 2:
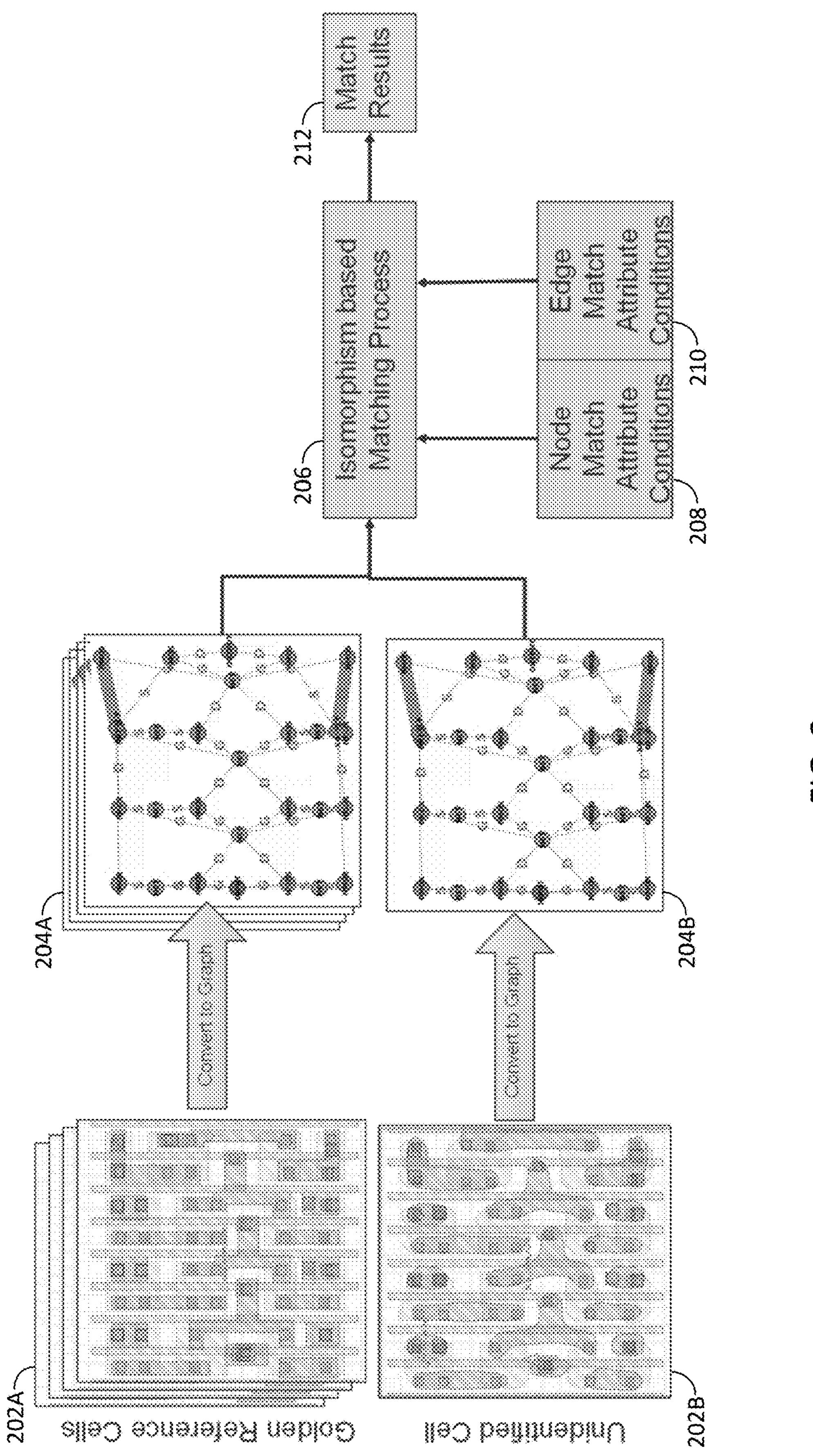
FIG. 2 is an example flow diagram illustrating one possible embodiment consistent with the present disclosure.

FIG. 2 is an illustrative example flow diagram of one possible embodiment consistent with the present disclosure. In the example of FIG. 2, golden reference cell 202A and unidentified cell 202B are converted into graph 204A and graph 204B, respectively. In the graph 204A and graph 204B, the nodes of the graphs represent gates and signals of the cells, while the edges represent the terminal to which the node is connected. The graphs are then fed into matching process 206, which first performs an isomorphism matching process on the two graphs. If the two graphs are determined to be isomorphic, then node attributes of the two graphs are compared to node match attribute conditions 208 and the edge attributes of the two graphs are compared to edge match attribute conditions 210 to determine the match results 212. This process is described in more detail in FIG. 3 below.

Figure 3:
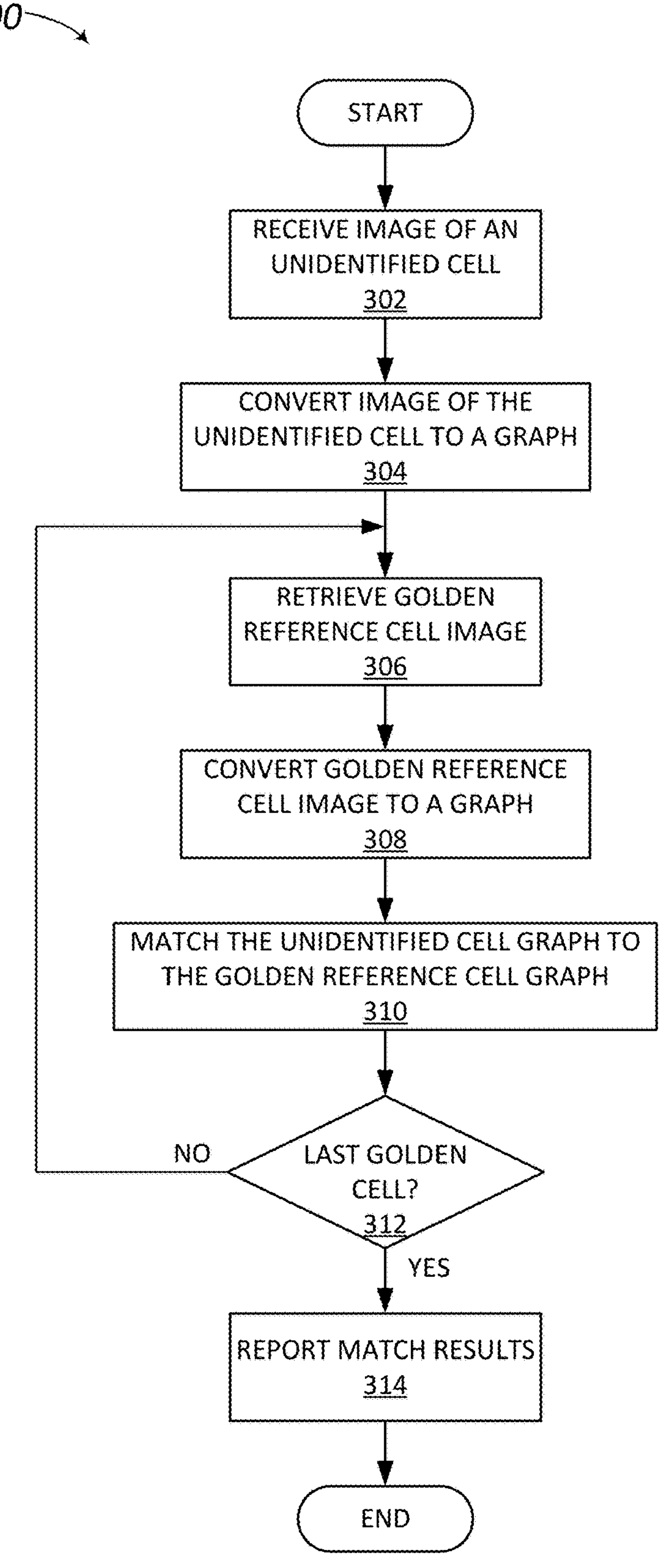
FIG. 3 is an example flowchart diagram depicting operations for standard cell differentiation using topology and transistor attributes, on the distributed data processing environment of FIG. 1, consistent with the present disclosure.

FIG. 3 is an example flowchart diagram depicting operations for program 112 for standard cell differentiation using topology and transistor attributes, on the distributed data processing environment of FIG. 1, consistent with the present disclosure. In an alternative embodiment, the operations of workflow 300 may be performed by any other program while working with program 112.

It should be appreciated that embodiments of the present disclosure provide at least for standard cell differentiation using topology and transistor attributes. However, FIG. 3 provides only an illustration of one implementation and does not imply any limitations with regard to the environments in which different embodiments may be implemented. Many modifications to the depicted environment may be made by those skilled in the art without departing from the scope of the disclosure as recited by the claims.

The program 112 receives a circuit representation of an unidentified cell (operation 302). In the illustrated example embodiment, the program 112 receives a circuit representation of an unidentified cell from a user. The circuit representation may be in the form of a GDSII file of the unidentified cell, a recovered circuit representation, e.g., one derived from a Scanning Electron Microscope (SEM) image of one or more layers of the unidentified cell, or any other appropriate format as would be known to a person of skill in the art.

The program 112 converts the circuit representation of the unidentified cell to a graph (operation 304). In order to convert the circuit representation of the unidentified cell to a graph, the program 112 extracts transistors from the circuit representation of the unidentified cell and the metal traces connected to standard cells. The program 112 then produces a netlist of the extracted transistors and how they are connected in the layout. In some embodiments, the netlist may be, for example, in Simulation Program with Integrated Circuit Emphasis (SPICE) format. The program 112 then parses the netlist and converts it into a graph using, for example, the Python NetworkX library.

In some embodiments, the program 112 uses existing tools for interacting and performing operations on the layers and/or polygons within the GDSII file. The operations performed by these tools may include, but are not limited to, performing Boolean operations on the regions, layers, and/or polygons in the GDSII file, determining the connections and/or nets by tracing between polygons and/or layers, determining the size and/or placement of transistors, and generating a transistor level netlist.

Since many graphs can be equivalent, while the underlying cell may not be equivalent, in some embodiments the program 112 may add attributes to the nodes and the edges of the graph. In some embodiments, a node attribute may be one or more of pMOS, nMOS, input, output, net, junction, number of fins, and one or more feature measurements, e.g., width. In other embodiments, the node attribute may be any other appropriate parameter of an IC cell as would be known to a person of skill in the art. In some embodiments, a terminal type attribute may be one of a source, a drain, or a gate.

The program 112 retrieves a golden reference cell circuit representation (operation 306). The program 112 determines one or more golden reference cells that may match the undefined cell. The program 112 then retrieves a circuit representation of one of the golden reference cells that may match the undefined cell.

The program 112 converts the golden reference cell circuit representation to a graph (operation 308). In order to convert the circuit representation of the golden reference cell to a graph, the program 112 extracts transistors from the circuit representation of the golden reference cell and the metal traces connected to standard cells. The program 112 then produces a netlist of the extracted transistors and how they are connected in the layout. In some embodiments, the netlist may be, for example, in SPICE format. The program 112 then parses the netlist and converts it into a graph using, for example, the Python NetworkX library.

In some embodiments, the program 112 uses existing tools for interacting and performing operations on the layers and/or polygons within the GDSII file. The operations performed by these tools may include, but are not limited to, performing Boolean operations on the regions, layers, and/or polygons in the GDSII file, determining the connections and/or nets by tracing between polygons and/or layers, determining the size and/or placement of transistors, and generating a transistor level netlist.

Since many graphs can be equivalent, while the underlying cell may not be equivalent, in some embodiments the program 112 may add attributes to the nodes and the edges of the graph. In some embodiments, a node attribute may be one or more of pMOS, nMOS, input, output, net, junction, number of fins, and one or more feature measurements, e.g., width. In other embodiments, the node attribute may be any other appropriate parameter of an IC cell as would be known to a person of skill in the art. In some embodiments, a terminal type attribute may be one of a source, a drain, or a gate.

The program 112 matches the unidentified cell graph to the golden reference cell graph (operation 310). The program 112 matches the graph of the unidentified cell to the graph of the golden reference cell to determine the overall fitness of the match. First, the program 112 determines if the graph of the unidentified cell is isomorphic to the graph of the golden reference cell. Two graphs which contain the same number of graph vertices connected in the same way are said to be isomorphic. In some embodiments, the program 112 uses existing algorithms to determine if the graph of the unidentified cell is isomorphic to the graph of the golden reference cell.

If the graph of the unidentified cell is isomorphic to the graph of the golden reference cell, the gates (e.g., AND versus NAND) are determined, but there may be functional differences between the unidentified cell and the golden reference cell. Therefore, the program 112 uses the attributes assigned to the unidentified cell in operation 304 above and to the golden reference cell in operation 308 above to determine an overall fitness score for the match. If the program 112 determines that the graph of the unidentified cell is isomorphic to the graph of the golden reference cell, then the program 112 compares the node attributes of the unidentified cell to the node attributes of the golden reference cell to determine a node score and compares the edge attributes of the unidentified cell to edge attributes of the golden reference cell to determine an edge score. The program 112 then combines the node score with the edge score to determine a summary score for the golden reference cell. In some embodiments, the program 112 creates a summary score list and adds the summary score for the golden reference cell to the summary score list for the unidentified cell.

For some of the attributes, the program 112 uses exact matching where the attribute of the node or edge on the unidentified cell may be identical to the corresponding attribute of the node or edge on the golden reference cell. For other attributes, the program 112 uses approximate matching, or fuzzy matching, where the program 112 minimizes the differences of the attribute to determine a best fit, and where the best fit is the minimum difference of the attributes. One example of the use of approximate matching may be feature geometry, where two equivalent features may have slightly different geometries due to process variations or analog tuning. When using approximate matching, the program 112 assigns a fitness score to the attribute based on the level of the fit, e.g., a closer fit between the attribute in the unidentified cell to the corresponding attribute in the golden reference cell will yield a higher fitness score. For example, if two graphs are topologically identical, then the program 112 may compare the corresponding width of transistors between the unidentified cell and the golden reference cell, and the differences in the size of the polygons will affect the fitness score, e.g., the greater the difference in the size of the polygons, the lower the fitness score.

Once the nodes, edges, node attributes, and edge attributes have been matched, the program 112 determines an overall fitness score for the match between the unidentified cell and the golden reference cell based on the individual fitness scores of the attributes, e.g., by adding the individual fitness scores of the attributes.

The program 112 determines if this is the last golden reference cell (decision block 312). The program 112 determines if the golden reference cell retrieved in operation 306 is the last golden reference cell selected for a possible match with the unidentified cell. If the program 112 determines that the golden reference cell retrieved in operation 306 is the last golden reference cell selected for a possible match with the unidentified cell ("yes" branch, decision block 312), then the program 112 proceeds to operation 314 to report the results. If the program 112 determines that the golden reference cell retrieved in operation 306 is not the last golden reference cell selected for a possible match with the unidentified cell ("no" branch, decision block 312), then the program 112 returns to operation 306 to retrieve the next golden reference cell.

The program 112 reports the match results (operation 314). Once the program 112 determines that the golden reference cell retrieved in operation 306 is the last golden reference cell selected for a possible match with the unidentified cell, then program 112 prepares a report of the golden reference cells that match the unidentified cell for a user. In the case where a single golden reference cell matches the unidentified cell, the report consists of that particular golden reference cell. In some embodiments, the report may also include a summary score of the fitness of the unidentified cell to the golden reference cell.

In the case where a plurality of golden reference cells match the unidentified cell, then the report may include the golden reference cells that match the unidentified cell. In some embodiments where a plurality of golden reference cells match the unidentified cell, the report may also include the summary score of the fitness of the unidentified cell for each matching golden reference cell. In some embodiments where a plurality of golden reference cells match the unidentified cell, the report may be sorted by the summary scores for each matching golden reference cell to allow the user to quickly determine the best fit golden reference cell, where the highest summary score is the best fit. The program 112 then ends for this cycle.

Figure 4:
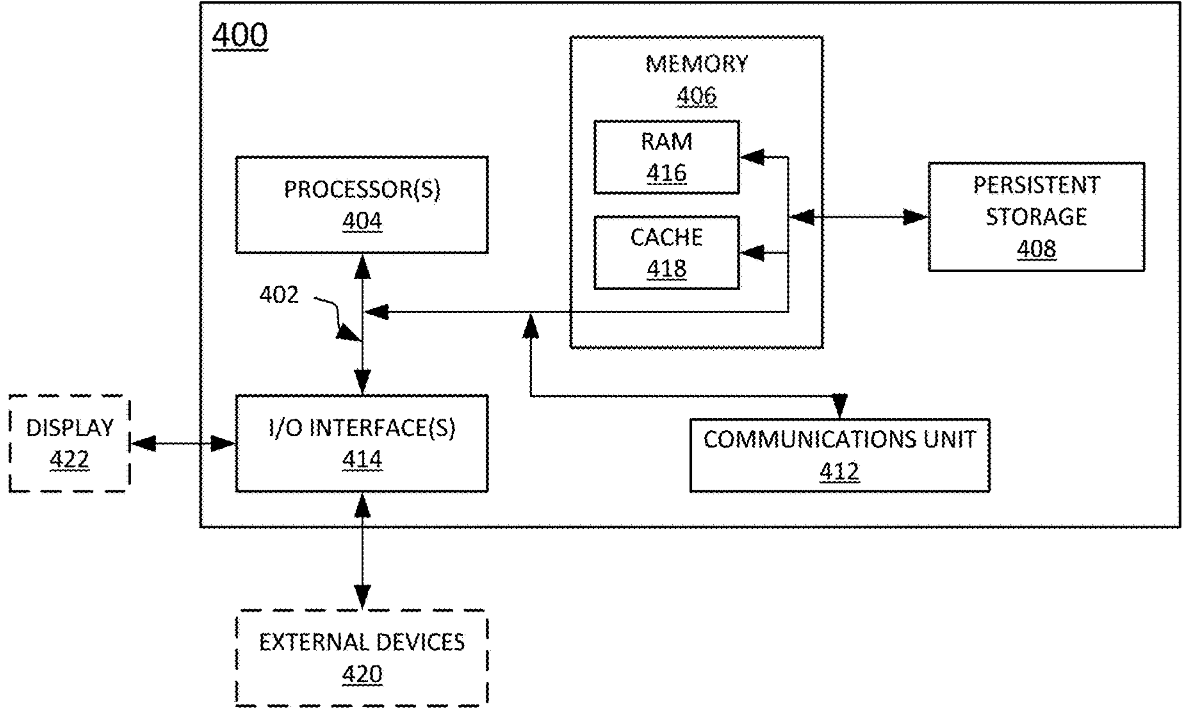
FIG. 4 is a block diagram depicting components of one example of a computing device suitable for the distributed data processing environment of FIG. 1, consistent with the present disclosure.

FIG. 4 is a block diagram depicting components of one example of the computing device 110 suitable for the program 112, within the distributed data processing environment of FIG. 1, consistent with the present disclosure. FIG. 4 displays the computing device or controller 400, one or more processor(s) 404 (including one or more computer processors), a communications fabric 402, a memory 406 including, a random-access memory (RAM) 416 and a cache 418, a persistent storage 408, a communications unit 412, I/O interfaces 414, a display 422, and external devices 420. It should be appreciated that FIG. 4 provides only an illustration of one embodiment and does not imply any limitations with regard to the environments in which different embodiments may be implemented. Many modifications to the depicted environment may be made.

As depicted, the computer 400 operates over the communications fabric 402, which provides communications between the computer processor(s) 404, memory 406, persistent storage 408, communications unit 412, and input/output (I/O) interface(s) 414. The communications fabric 402 may be implemented with an architecture suitable for passing data or control information between the processors 404 (e.g., microprocessors, communications processors, and network processors), the memory 406, the external devices 420, and any other hardware components within a system. For example, the communications fabric 402 may be implemented with one or more buses.

The memory 406 and persistent storage 408 are computer readable storage media. In the depicted embodiment, the memory 406 comprises a RAM 416 and a cache 418. In general, the memory 406 can include any suitable volatile or non-volatile computer readable storage media. Cache 418 is a fast memory that enhances the performance of processor(s) 404 by holding recently accessed data, and near recently accessed data, from RAM 416.

Program instructions for the program 112 may be stored in the persistent storage 408, or more generally, any non-transitory computer readable storage media, for execution by one or more of the respective computer processors 404 via one or more memories of the memory 406. The persistent storage 408 may be a magnetic hard disk drive, a solid-state disk drive, a semiconductor storage device, flash memory, read only memory (ROM), electronically erasable programmable read-only memory (EEPROM), or any other computer readable storage media that is capable of storing program instruction or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 408.

The communications unit 412, in these examples, provides for communications with other data processing systems or devices. In these examples, the communications unit 412 includes one or more network interface cards. The communications unit 412 may provide communications through the use of either or both physical and wireless communications links. In the context of some embodiments of the present disclosure, the source of the various input data may be physically remote to the computer 400 such that the input data may be received, and the output similarly transmitted via the communications unit 412.

The I/O interface(s) 414 allows for input and output of data with other devices that may be connected to computer 400. For example, the I/O interface(s) 414 may provide a connection to external device(s) 420 such as a keyboard, a keypad, a touch screen, a microphone, a digital camera, and/or some other suitable input device. External device(s) 420 can also include portable computer readable storage media such as, for example, thumb drives, portable optical or magnetic disks, and memory cards. Software and data used to practice embodiments of the present disclosure, e.g., the program 112, can be stored on such portable computer readable storage media and can be loaded onto persistent storage 408 via the I/O interface(s) 414. I/O interface(s) 414 also connect to a display 422.

Display 422 provides a mechanism to display data to a user and may be, for example, a computer monitor. Display 422 can also function as a touchscreen, such as a display of a tablet computer.

According to one aspect of the disclosure there is thus provided a computer-implemented method for standard cell differentiation using topology and transistor attributes, including: receiving, by one or more computer processors, a first circuit representation of an unidentified cell; converting, by the one or more computer processors, the first circuit representation of the unidentified cell to a first graph; retrieving, by the one or more computer processors, a second circuit representation of each of one or more golden reference cells; converting, by the one or more computer processors, the second circuit representation of each of the one or more golden reference cells to one or more second graphs; matching, by the one or more computer processors, the first graph to each of the one or more second graphs; and reporting, by the one or more computer processors, one or more match results based on the matching of the first graph to each of the one or more second graphs.

According to another aspect of the disclosure, there is thus provided a system for standard cell differentiation using topology and transistor attributes, the system including: one or more computer processors; one or more computer readable storage media; and program instructions stored on the one or more computer readable storage media for execution by at least one of the one or more computer processors, the stored program instructions including instructions to: receive a first circuit representation of an unidentified cell; convert the first circuit representation of the unidentified cell to a first graph; retrieve a second circuit representation of each of one or more golden reference cells; convert the second circuit representation of each of the one or more golden reference cells to one or more second graphs; match the first graph to each of the one or more second graphs; and report one or more match results based on the match of the first graph to each of the one or more second graphs.

According to yet another aspect of the disclosure, there is provided a system for standard cell differentiation using topology and transistor attributes, the system including: one or more computer processors; one or more computer readable storage media; and program instructions stored on the one or more computer readable storage media for execution by at least one of the one or more computer processors, the stored program instructions including instructions to: receive a first circuit representation of an unidentified cell; convert the first circuit representation of the unidentified cell to a first graph; retrieve a second circuit representation of each of one or more golden reference cells; convert the second circuit representation of each of the one or more golden reference cells to one or more second graphs; determine whether the first graph and any of the one or more second graphs are isomorphic; and for each of the one or more second graphs that is isomorphic with the first graph: determine a node score by comparing one or more first node attributes of the first graph to one or more second node attributes of the second graph; determine an edge score by comparing one or more first edge attributes of the first graph to one or more second edge attributes of the second graph; and determine a summary score based on the node score and the edge score, wherein the summary score is a measure of an overall fitness of a match of the first graph to each second graph of the one or more second graphs; and add the summary score for each of the one or more second graphs that is isomorphic with the first graph to a summary score list.

The programs described herein are identified based upon the application for which they are implemented in a specific embodiment of the disclosure. However, it should be appreciated that any particular program nomenclature herein is used merely for convenience, and thus the disclosure should not be limited to use solely in any specific application identified and/or implied by such nomenclature.

The present disclosure may be a system, and/or a computer implemented method. The system and/or computer implemented method may include a non-transitory computer readable storage medium (or media) having computer readable program instructions thereon for causing a processor to carry out aspects of the present disclosure.

The computer readable storage medium can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a RAM, a ROM, an EPROM or Flash memory, a Static Random Access Memory (SRAM), a portable Compact Disc Read-Only Memory (CD-ROM), a Digital Versatile Disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, Instruction-Set-Architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some embodiments, electronic circuitry including, for example, programmable logic circuitry, Field-Programmable Gate Arrays (FPGA), or other Programmable Logic Devices (PLD) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operations to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the disclosure. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method for standard cell differentiation using topology and transistor attributes, the computer-implemented method comprising:

receiving, by one or more computer processors, a first circuit representation of an unidentified cell;

converting, by the one or more computer processors, the first circuit representation of the unidentified cell to a first graph;

retrieving, by the one or more computer processors, a second circuit representation of each of one or more golden reference cells;

converting, by the one or more computer processors, the second circuit representation of each of the one or more golden reference cells to one or more second graphs;

matching, by the one or more computer processors, the first graph to each of the one or more second graphs; and reporting, by the one or more computer processors, one or more match results based on the matching of the first graph to each of the one or more second graphs.

2. The computer-implemented method of claim 1, wherein matching the first graph to each of the one or more second graphs further comprises:

determining, by the one or more computer processors, whether the first graph and any of the one or more second graphs are isomorphic; and for each of the one or more second graphs that is isomorphic with the first graph:

determining, by the one or more computer processors, a node score by comparing one or more first node attributes of the first graph to one or more second node attributes of the second graph that is isomorphic with the first graph;

determining, by the one or more computer processors, an edge score by comparing one or more first edge attributes of the first graph to one or more second edge attributes of the second graph that is isomorphic with the first graph; and determining, by the one or more computer processors, a summary score based on the node score and the edge score, wherein the summary score is a measure of an overall fitness of the matching.

3. The computer-implemented method of claim 2, wherein the comparing of the one or more first node attributes to the one or more second node attributes and the comparing of the one or more first edge attributes to the one or more second edge attributes of the second graph use exact matching, wherein a first attribute matches a second attribute if the first attribute is identical to the second attribute.

4. The computer-implemented method of claim 2, wherein the comparing of the one or more first node attributes to the one or more second node attributes and the comparing of the one or more first edge attributes to the one or more second edge attributes of the second graph use approximate matching, wherein a first attribute matches a second attribute if the first attribute is a best fit to the second attribute.

5. The computer-implemented method of claim 2, wherein the one or more first node attributes and the one or more second node attributes include at least one of pMOS, nMOS, input, output, net, junction, one or more feature measurements, and number of fins.

6. The computer-implemented method of claim 2, wherein the one or more first edge attributes and the one or more second edge attributes include a terminal type, wherein the terminal type is selected from the group consisting of source, drain, and gate.

7. The computer-implemented method of claim 2, wherein converting the first circuit representation of the unidentified cell to the first graph comprises:

extracting, by the one or more computer processors, one or more transistors and one or more metal traces from the first circuit representation;

producing, by the one or more computer processors, a netlist of the one or more transistors and the one or more metal traces that were extracted; and converting, by the one or more computer processors, the netlist into the first graph.

8. The computer-implemented method of claim 2, wherein reporting the one or more match results based on the matching of the first graph to the second graph further comprises:

adding, by the one or more computer processors, the summary score for each of the one or more second graphs that is isomorphic with the first graph to a summary score list;

sorting, by the one or more computer processors, the summary score list; and reporting, by the one or more computer processors, the summary score list to a user.

9. The computer-implemented method of claim 1, wherein the first circuit representation of the unidentified cell is a recovered circuit representation of one or more layers of the unidentified cell.

10. The computer-implemented method of claim 9, wherein the first circuit representation of the unidentified cell is derived from a Scanning Electron Microscope (SEM) image of the one or more layers of the unidentified cell.

11. A system for standard cell differentiation using topology and transistor attributes, the system comprising:

one or more computer processors;

one or more computer readable storage media; and program instructions stored on the one or more computer readable storage media for execution by at least one of the one or more computer processors, the stored program instructions including instructions to:

receive a first circuit representation of an unidentified cell;

convert the first circuit representation of the unidentified cell to a first graph;

retrieve a second circuit representation of each of one or more golden reference cells;

convert the second circuit representation of each of the one or more golden reference cells to one or more second graphs;

match the first graph to each of the one or more second graphs; and report one or more match results based on the match of the first graph to each of the one or more second graphs.

12. The system of claim 11, wherein match the first graph to each of the one or more second graphs further comprises one or more of the following program instructions, stored on the one or more computer readable storage media, to:

determine whether the first graph and any of the one or more second graphs are isomorphic; and for each of the one or more second graphs that is isomorphic with the first graph:

determine a node score by comparing one or more first node attributes of the first graph to one or more second node attributes of the second graph that is isomorphic with the first graph;

determine an edge score by comparing one or more first edge attributes of the first graph to one or more second edge attributes of the second graph that is isomorphic with the first graph; and determine a summary score based on the node score and the edge score, wherein the summary score is a measure of an overall fitness of the match.

13. The system of claim 12, wherein comparing the one or more first node attributes to the one or more second node attributes and the comparing the one or more first edge attributes to the one or more second graph attributes use exact matching, wherein a first attribute matches a second attribute if the first attribute is identical to the second attribute.

14. The system of claim 12, wherein comparing the one or more first node attributes to the one or more second node attributes and the comparing the one or more first edge attributes to the one or more second graph attributes use approximate matching, wherein a first attribute matches a second attribute if the first attribute is a best fit to the second attribute.

15. The system of claim 12, wherein the one or more first node attributes and the one or more second node attributes include at least one of pMOS, nMOS, input, output, net, junction, number of fins, and one or more feature measurements.

16. The system of claim 12, wherein the one or more first edge attributes and the one or more second edge attributes include a terminal type, wherein the terminal type is selected from the group consisting of source, drain, and gate.

17. The system of claim 11, wherein convert the first circuit representation of the unidentified cell to the first graph comprises:

extract one or more transistors and one or more metal traces from the first circuit representation;

produce a netlist of the one or more transistors and the one or more metal traces that were extracted; and convert the netlist into the first graph.

18. The system of claim 12, wherein report the one or more match results based on the match of the first graph to each of the one or more second graphs further comprises:

add the summary score for each of the one or more second graphs that is isomorphic with the first graph to a summary score list;

sort the summary score list; and report the summary score list to a user.

19. The system of claim 11, wherein the first circuit representation of the unidentified cell is a Graphic Design System II (GDSII) file.

20. A system for standard cell differentiation using topology and transistor attributes, the system comprising:

one or more computer processors;

one or more computer readable storage media; and program instructions stored on the one or more computer readable storage media for execution by at least one of the one or more computer processors, the stored program instructions including instructions to:

receive a first circuit representation of an unidentified cell;

convert the first circuit representation of the unidentified cell to a first graph;

retrieve a second circuit representation of each of one or more golden reference cells;

convert the second circuit representation of each of the one or more golden reference cells to one or more second graphs;

determine whether the first graph and any of the one or more second graphs are isomorphic; and for each of the one or more second graphs that is isomorphic with the first graph:

determine a node score by comparing one or more first node attributes of the first graph to one or more second node attributes of the second graph;

determine an edge score by comparing one or more first edge attributes of the first graph to one or more second edge attributes of the second graph; and determine a summary score based on the node score and the edge score, wherein the summary score is a measure of an overall fitness of a match of the first graph to each second graph of the one or more second graphs; and add the summary score for each of the one or more second graphs that is isomorphic with the first graph to a summary score list.

* * * * *